United States Patent [19]

Ismail et al.

[11] Patent Number: 5,534,713
[45] Date of Patent: Jul. 9, 1996

[54] COMPLEMENTARY METAL-OXIDE SEMICONDUCTOR TRANSISTOR LOGIC USING STRAINED SI/SIGE HETEROSTRUCTURE LAYERS

[75] Inventors: Khaled E. Ismail, Cairo, Egypt; Frank Stern, Pleasantville, N.Y.

[73] Assignee: International Business Machines Corporation, Armonk, N.Y.; a part interest

[21] Appl. No.: 246,549

[22] Filed: May 20, 1994

[51] Int. Cl.$^6$ .................................................. H01L 29/06
[52] U.S. Cl. ........................ 257/24; 257/190; 257/192; 257/616
[58] Field of Search .............................. 257/19, 20, 24, 257/190, 192, 194, 616

[56] References Cited

U.S. PATENT DOCUMENTS

| | | | |
|---|---|---|---|
| 4,710,788 | 12/1987 | Dämbkes et al. | 257/194 |
| 5,006,912 | 4/1991 | Smith et al. | |
| 5,019,882 | 5/1991 | Solomon et al. | |
| 5,155,571 | 10/1992 | Wang et al. | |
| 5,227,644 | 7/1993 | Ueno | 257/192 |
| 5,241,197 | 8/1993 | Murakami et al. | 257/192 |

FOREIGN PATENT DOCUMENTS

| | | | |
|---|---|---|---|
| 3731000 | 3/1989 | Germany | 257/190 |
| 63-308966 | 12/1988 | Japan | 257/616 |
| 5-114708 | 5/1993 | Japan | 257/192 |

OTHER PUBLICATIONS

"Si/SiGe Heterostructure MOS Devices with Step–Graded Bandgap Profile of the SiGe Channel," IBM Technical Disclosure Bulletin, vol. 36, No. 03, Mar. 1993, pp. 127–129.

Ismail et al., "High–Performance Si/SiGe n–Type Modulation–Doped Transistors," IEEE Electron Device Letters, vol. 14, No. 7, Jul. 1993, pp. 348–350.

*Primary Examiner*—Sara W. Crane
*Assistant Examiner*—Courtney A. Bowers
*Attorney, Agent, or Firm*—Robert M. Trepp

[57] ABSTRACT

A method and a layered planar heterostructure comprising one of or both n and p-channel field effect transistors is described incorporating a plurality of semiconductor layers on a semiconductor substrate wherein one layer is silicon or silicon germanium under tensile strain and one layer is silicon germanium under compressive strain whereby n channel field effect transistors may be formed with a silicon or silicon germanium layer under tension and p-channel field effect transistors may be formed with a silicon germanium layer under compression. The plurality of layers may be common to both subsequently formed p and n-channel field effect transistors which may be interconnected to form CMOS circuits. The invention overcomes the problem of forming separate and different layered structures for p and n-channel field effect transistors for CMOS circuitry on ULSI chips.

11 Claims, 6 Drawing Sheets

COMPLEMENTARY METAL-OXIDE SEMICONDUCTOR TRANSISTOR LOGIC USING STRAINED SI/SIGE HETEROSTRUCTURE LAYERS

FIELD OF THE INVENTION

This invention relates to complementary metal oxide semiconductor (CMOS) logic for ultra large scale integrated (ULSI) circuits and more particularly to high performance p and n channel field effect transistors fabricated in a heterostructure incorporating strained silicon and silicon germanium layers.

BACKGROUND OF THE INVENTION

Performance improvement of Si-CMOS devices, which form the most important building blocks in logic applications, is of significant importance. In specific, higher speed and lower power consumption together with miniaturization are essential requirements for future ULSI chips. One major deterrent against high speed performance is the low mobility of holes in Si. In addition, devices with 0.1–0.15 micron gates will have to be exposed using either electron-beam lithograph or x-ray lithography, both being more complicated and expensive techniques compared to optical lithography. Furthermore, device reliability, threshold voltage control, and yield problems become more pronounced on that scale. The choice of a material system fully compatible with Si technology, but having superior properties compared to Si would improve the power-delay product of CMOS. It is conceivable that similar or better performance than for 0.15 micron Si-CMOS can be achieved at 0.25 micron gate length, thus allowing the gates to be exposed by optical lithography.

One example of a material system compatible with Si technology, is described in U.S. Pat. No. 5,019,882 which issued on May 28, 1991 to P. M. Solomon entitled "Germanium Channel Silicon MOSFET" and assigned to the assignee herein. In U.S. Pat. No. 5,019,882, a channel having improved carrier mobility comprises an alloy layer of silicon and germanium which is grown above a silicon substrate. The alloy layer is kept thin enough for proper pseudomorphic dislocation free growth. A layer of silicon is formed over the alloy layer and is oxidized partially through to form a dielectric layer. A gate region is formed over the silicon dioxide.

In U.S. Pat. No. 5,155,571 which issued on Oct. 13, 1992 to K. L. Wang et al, complementary field effect transistors are described having strained superlattice structure. In U.S. Pat. No. 5,155,571 a silicon CMOS transistor structure is described utilizing an n-type strained $Ge_xSi_{1-x}$ layer for the p-channel transistor whereby the mobility of the holes is increased to match the mobility of the electrons in n-channel transistor. Further, a complementary modulation doped field effect transistor is described using strained Si and GeSi alloy layers and a relaxed $Ge_xSi_{1-x}$ to enhance the electron mobility in the n-channel transistor while a strained Si or a strained $Ge_xSi_{1-x}$ alloy layer is used to enhance the hole mobility in the p-channel transistor. Regions for p-channel transistors and regions for n-channel transistors are separate regions with respective channels made of a different structure.

In Japanese patent 63-308966(a) which issued on Dec. 16, 1988 to K. Fujimori, n and p-channel transistors are described on a substrate which are formed by changing silicon and silicon-germanium mixed crystal layers in the vertical direction in the same composition and film thickness and making only impurity density to differ in structure under the gate electrodes.

In U.S. Pat. No. 5,006,912 which issued on Apr. 9, 1991 to C. Smith et al, a heterojunction bipolar transistor is described having an emitter which comprises an epitaxial layer of silicon grown on a silicon and germanium base layer. The active region of the transistor comprises a semiconductor having a silicon/silicon and germanium strained lattice, and the lattice strain being such as to produce a predetermined valence band offset at the emitter/base junction while maintaining commensurate growth. The advantage of the lattice strain is such as to enhance the effective mobility of electrons in the base. The germanium content of the silicon and germanium base layer lies within the range of from 12% to 20%

Another example of a field effect transistor having a high carrier mobility and suited for high speed operation is described in U.S. Pat. No. 5,241,197 which issued on Aug. 31, 1993 to E. Murakami et al. In U.S. Pat. No. 5,241,197 a strained control layer is provided beneath a germanium layer to impose a compressive strain on the germanium layer, and the composition of the strain control layer is used to generate the compressive strain. The carrier mobility in the strained germanium layer is large.

SUMMARY OF THE INVENTION

In accordance with the present invention, a method and a layered structure which may be planar is described for forming both n and p-channel field effect transistors therein comprising a semiconductor substrate, a first layer of relaxed $Si_{1-x}Ge_x$ formed epitaxially on the substrate where the Ge fraction x is in the range from 0.20 to 0.5, a second layer of n doped $Si_{1-x}Ge_x$ formed epitaxially on the first layer, a third layer of undoped $Si_{1-x}Ge_x$ formed epitaxially on the second layer, a fourth layer of silicon or $Si_{1-z}Ge_z$ where the Ge fraction z is less than x formed epitaxially on the third layer whereby the fourth layer is under tensile strain, a fifth layer of relaxed $Si_{1-x}Ge_x$ formed epitaxially on the fourth layer, a sixth layer of $Si_{1-y}Ge_y$ formed epitaxially on the fifth layer where the Ge fraction y is in the range from 0.5 to 1.0 and where y−x is greater than 0.2 whereby the sixth layer is under compressive strain, a seventh layer of relaxed $Si_{1-x}Ge_x$ formed epitaxially on the sixth layer, an eighth layer of silicon formed epitaxially on the seventh layer, and a ninth layer of dielectric material formed over the eighth layer. The Ge fraction x for each layer may have its own value in the range from 0.20 to 0.5 so long as the value does not reverse the tensile or compressive strain in the designated layers for holes and electrons. A metal or polysilicon layer may be formed and patterned over the ninth layer to form the gates of the n and p-channel field effect transistors. The drain and source regions of respective n and p-channel transistors may be formed by forming n regions on either side of the gate in the layered structure to form n-channel field effect transistors and p regions on either side of the gate in the layered structure to form p-channel field effect transistors. The n and p channel transistors may be interconnected to form CMOS logic.

The invention further provides a method and a p-channel field effect transistor having a source, drain, gate and increased hole mobility in its channel comprising a semiconductor substrate, a first layer of relaxed $Si_{1-x}Ge_x$ formed epitaxially on the substrate where x is in the range from 0.20 to 0.5, a second layer of $Si_{1-y}Ge_y$ formed epitaxially on the first layer where the Ge fraction y is in the range from 0.5 to 1 and where y–x is greater than 0.2 whereby the second layer is under compressive strain resulting in hole confinement therein, a third layer of silicon formed epitaxially on the second layer, a fourth layer of dielectric material formed over the third layer, a gate electrode formed over the fourth layer and p regions formed on either side of the gate electrode in the second and third layers.

The invention further provides a method and an n-channel field effect transistor having a source, drain, gate and increased electron mobility in its channel comprising a semiconductor substrate, a first layer of relaxed $Si_{1-x}Ge_x$ formed epitaxially on the substrate where x is in the range from 0.25 to 0.5, a second layer of n-doped $Si_{1-x}Ge_x$ formed epitaxially on the first layer, a third layer of undoped $Si_{1-x}Ge_x$ formed epitaxially on the second layer, a fourth layer of silicon or $Si_{1-z}Ge_z$ where the Ge fraction z is less than x formed epitaxially on the third layer whereby the fourth layer is under tensile strain whereby the conduction band is split into a two-fold and a four-fold degenerate band with electron mobility in the two-fold band being in the range from 2,000 to 2,500 $cm^2/Vs$ at 300K, a fifth layer of dielectric material formed over the fourth layer, a gate electrode formed over the fifth layer, and n-type regions formed on either side of the gate electrode in the third and fourth layers.

It is an object of the invention to provide a layered structure which allows for both n-channel and p-channel devices to be formed in a common planar structure.

It is a further object of the invention to provide both n-channel and p-channel devices where no active channel is formed at the silicon dioxide interface thus preventing degradation of mobility with increased vertical field.

It is a further object of the invention to provide a p-channel device having a p-channel closer to the gate than a corresponding n-channel device which proximity compensates for the lower hole mobility in the p-channel.

It is a further object of the invention to provide n-channel and p-channel devices where both electron and hole channels take advantage of strain (tensile for electrons, compressive for holes) with benefits from band splitting and from higher confining barriers.

It is a further object of the invention to provide n-channel and p-channel devices having higher mobilities which may allow operation at low source-drain voltage, for example, approximately 1.5 volts.

It is a further object of the invention to provide n-channel and p-channel devices which may be designed to have nearly symmetric threshold voltages for both electrons and holes.

It is a further object of the invention to provide a layered structure which is epitaxial for forming n-channel and p-channel devices where the measured defect densities are quite low, for example 1000 per $cm^2$ as seen from etch pit count.

It is a further object of the invention to provide a single common gate material and process step for the gates of both n-channel and p-channel field effect transistors.

It is a further object of the invention to provide a buried Si or SiGe channel under tensile strain for an n-channel device and a buried SiGe channel under compressive strain for a p-channel device.

BRIEF DESCRIPTION OF THE DRAWING

These and other features, objects, and advantages of the present invention will become apparent upon consideration of the following detailed description of the invention when read in conjunction with the drawing in which.

DESCRIPTION OF THE PREFERRED EMBODIMENTS

Figure 1:
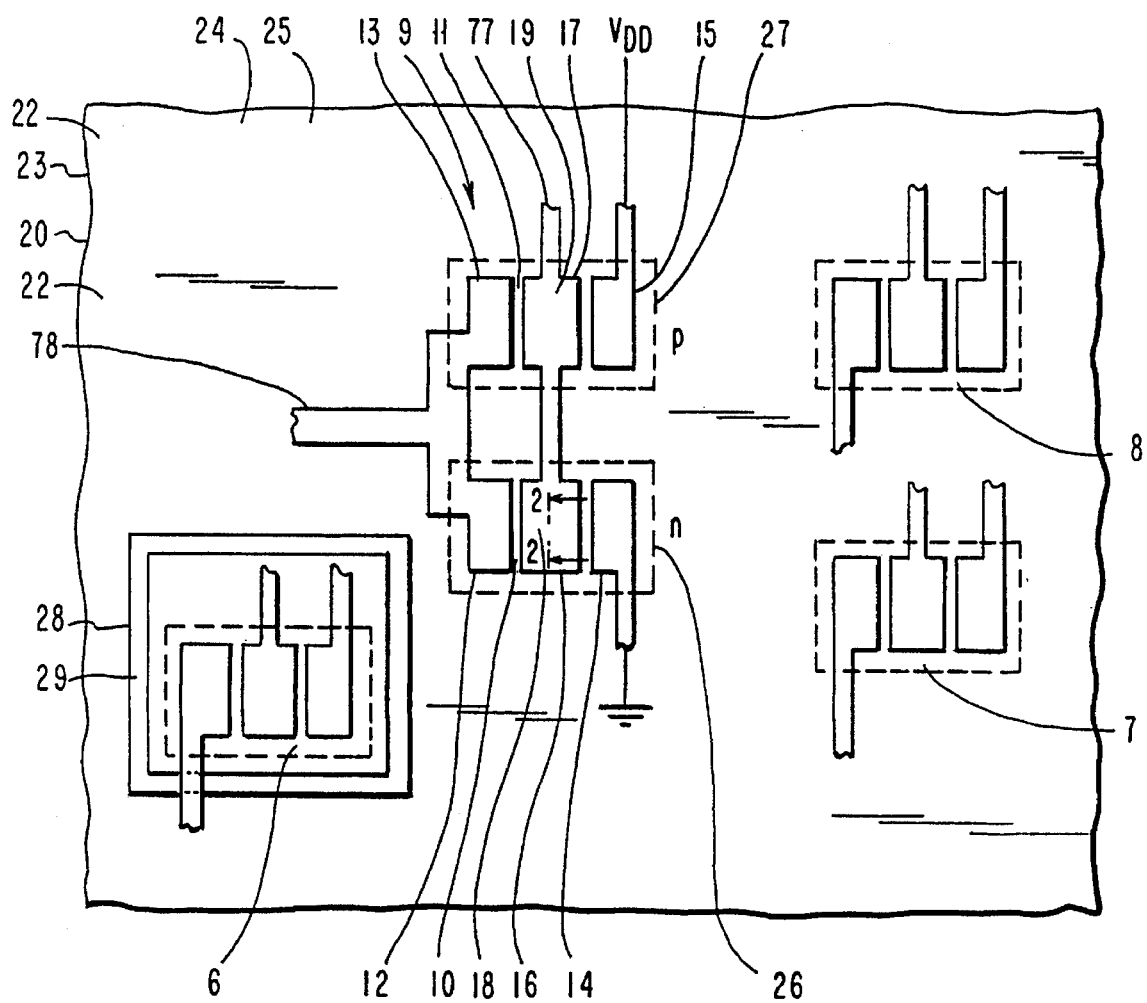
FIG. 1 is a top view of one embodiment of the invention.
Figure 5:
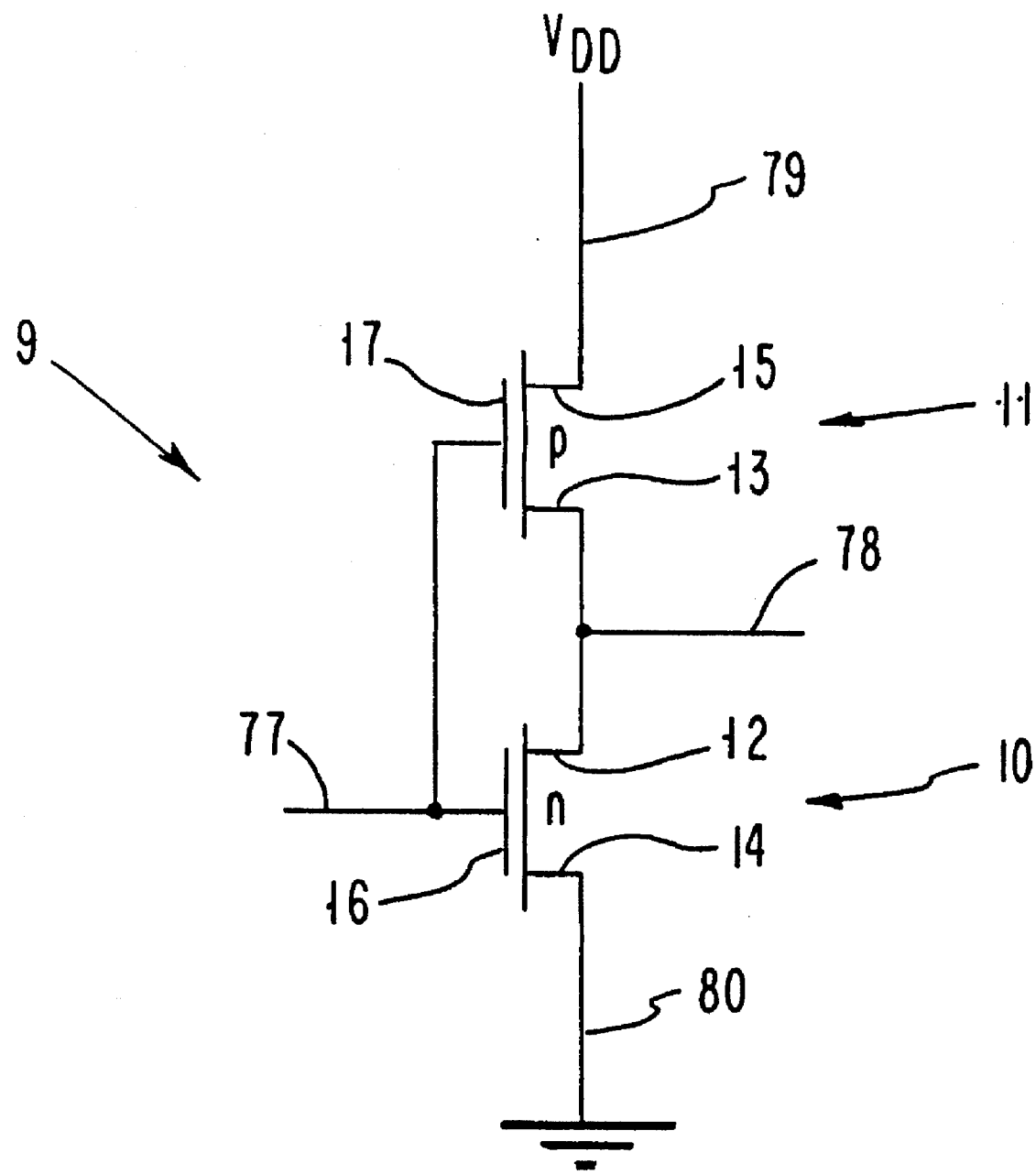
FIG. 5 is a schematic circuit of CMOS inverter 9 shown in FIG. 1.

Referring now to the drawing, FIG. 1 shows a top view of a field effect transistors 10 and 11 interconnected to form a complementary metal oxide semiconductor (CMOS) inverter 9. The detailed schematic circuit of CMOS inverter is shown in FIG. 5.

Field effect transistor 10 may be an n-channel field effect transistor having drain and source regions 12 and 14 of n-type and a gate electrode 16. Field effect transistor 11 may be a p-channel field effect transistor having drain and source regions 13 and 15 of p-type material and a gate electrode 17. Gate electrodes 16 and 17 may be metal or may be polysilicon doped with p-type material. Gate electrode 16 has an upper surface 18 and gate electrode 17 has an upper surface 19. Field effect transistors 10 and 11 are formed on a semiconductor substrate 20 which may be, for example, silicon, silicon germanium or alloys thereof. Substrate 20 may also be a wafer where an upper region is separated by implanted oxygen (SIMOX). Substrate 20 has a planar heterostructure 22 formed on the upper surface 21 of substrate 20 shown in FIG. 2. Planar heterostructure 22 consists of a plurality of substantially planar layers 23 which are epitaxial, commensurate or pseudomorphic with respect to one another. The top layer 24 on heterostructure 22 is exposed to the ambient and may be a dielectric such as silicon dioxide having an upper surface 25.

While field effect transistors 10 and 11 have been shown in FIG. 1 many more transistors such as field effect transistors 6 through 8 of either n or p-channel may be formed on substrate 20. Planar heterostructure 22 consisting of a plurality of layers 23 shown in more detail in FIG. 2 extends underneath the gate electrodes of all the field effect transistors and will also be in the regions between the field effect transistors. Thus, a common planar heterostructure 22 is used for all transistors. Isolation between selected transistors may be obtained by interrupting the conductivity of the layers 23 such as by forming a trench 28 such as by reactive ion etching through a mask. Trench 28 which may have a square or rectangular cross section may be filled with a dielectric 29 such as silicon dioxide to permit interconnection wiring to pass over or across the trench.

Figure 2:
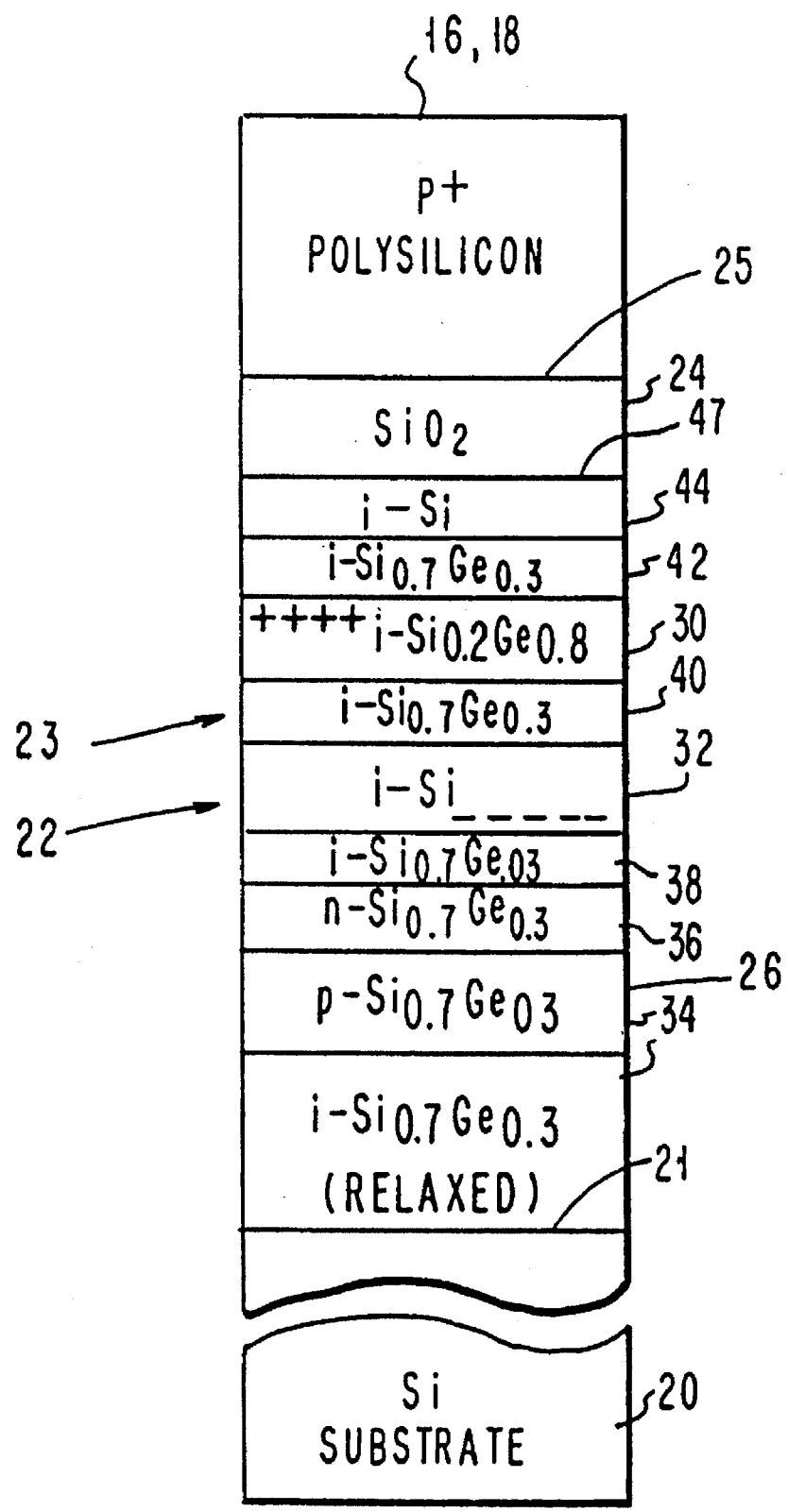
FIG. 2 is a cross-section view along the lines 2—2 of FIG. 1.

FIG. 2 is a cross-section view along the lines 2—2 of FIG. 1. As shown in FIGS. 1 and 2, substrate 20 has an upper surface 21 with a planar heterostructure 22 comprising layers 34, 36, 38, 32, 40, 30, 42 and 44 in epitaxial relationship formed thereover. Above planar heterostructure 22 is layer 24 which functions as a gate oxide for gate electrodes 16 and 17 and a thicker field oxide may be formed or deposited in regions between gate electrodes. In planar heterostructure 22 strain is made use of in order to improve the device performance. The unique features of the planar heterostructure 22 is that the layers have planar upper and lower surfaces across the substrate, i.e., no etching or selective growth is needed for p-channel field effect transistor 11 or PMOS devices and n-channel field effect transistor 10 or NMOS devices. The planar heterostructure 22 provides a medium which is compatible with standard submicron Si complementary metal oxide semiconductor (CMOS) processing.

By adjusting the strain in particular layers of planar heterostructure 22, the threshold voltages of p and n type field effect transistors 10 and 11 can be adjusted rather than by doping as in standard Si-MOS technology. Further adjustments to the threshold voltage by doping can also be used in addition to the voltage adjustment achieved with the strain in the layer. In planar heterostructure 22, symmetrical threshold voltages in the range from −0.3 to −0.5 volts for p-channel transistor and +0.3 to +0.5 volts for n-channel transistors can be achieved in the same planar heterostructure design. By using P$^+$ polysilicon gates as shown for example by gate electrode 16, both n and p-channel field effect transistors gate electrodes 16 and 17 may be formed at the same time thus saving one lithography step. The transconductance of the n and p-channel field effect transistors 10 and 11 may also be designed to be almost identical. The almost identical transconductances of n and p-channel field effect transistors is achieved by using the planar heterostructure 22 with the p-channel at layer 30 closer to the gate electrodes 16 and 17 compared to the n-channel 32 in order to compensate for the electron mobility which is higher in the n-channel at layer 32 than the hole mobility in the p-channel at layer 30.

Referring to FIG. 2, a relaxed SiGe buffer layer 34 is first grown on upper surface 21 of substrate 20 with a Ge composition in the range from 20 to 50%. Buffer layer 34 may be initially undoped, relaxed, and have a composition of 70% silicon and 30% germanium.

Figure 7:
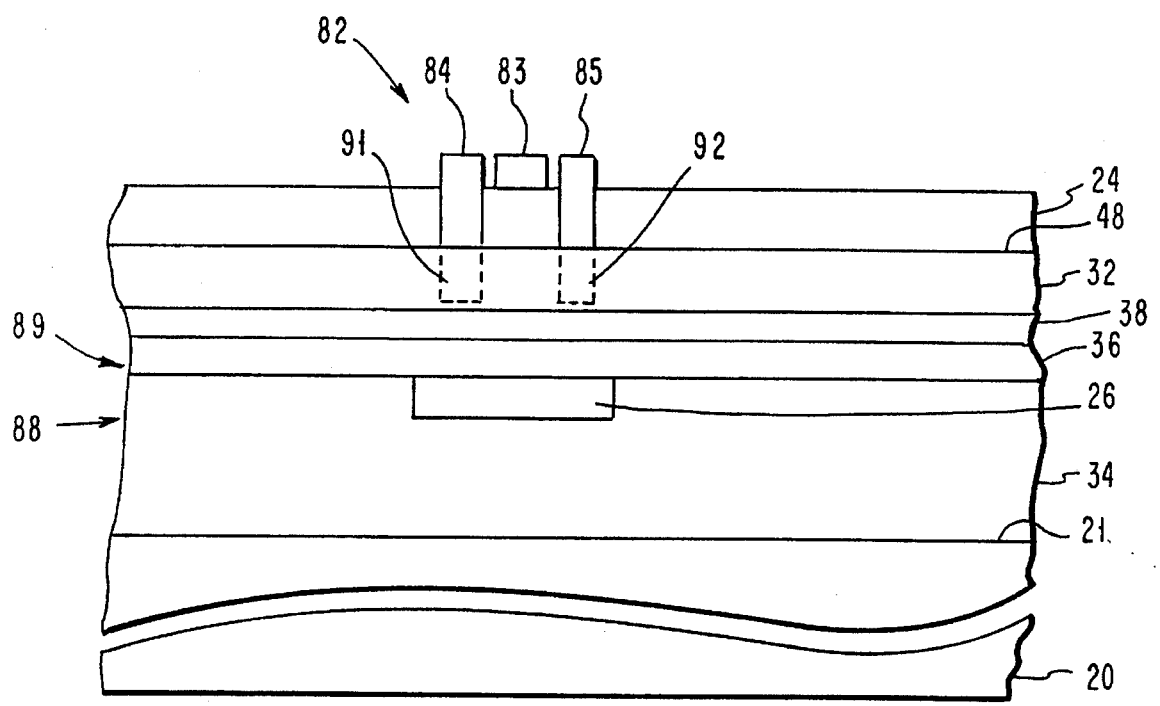
FIG. 7 is a cross section view along the line 7—7 of FIG. 6 illustrating the second embodiment.

After layer 34 is formed, a p type region 26 as shown in FIGS. 1 and 7 is formed in layer 34 at or near the top of layer 34 with a thickness in the range from 100 to 200 nm and has an electrically active acceptor dose in the range from 1 to $2\times10^{12}$cm$^{-2}$ underlying the n channel devices and associated drain and source regions 12 and 14 to be subsequently formed. Region 26 can be formed for example by ion implantation and subsequent annealing. Region 26 may be defined by a suitably patterned mask. P type region 26 functions to block parasitic current from flowing through layer 34 or substrate 20 between the source and drain contacts of n type transistors.

Figure 8:
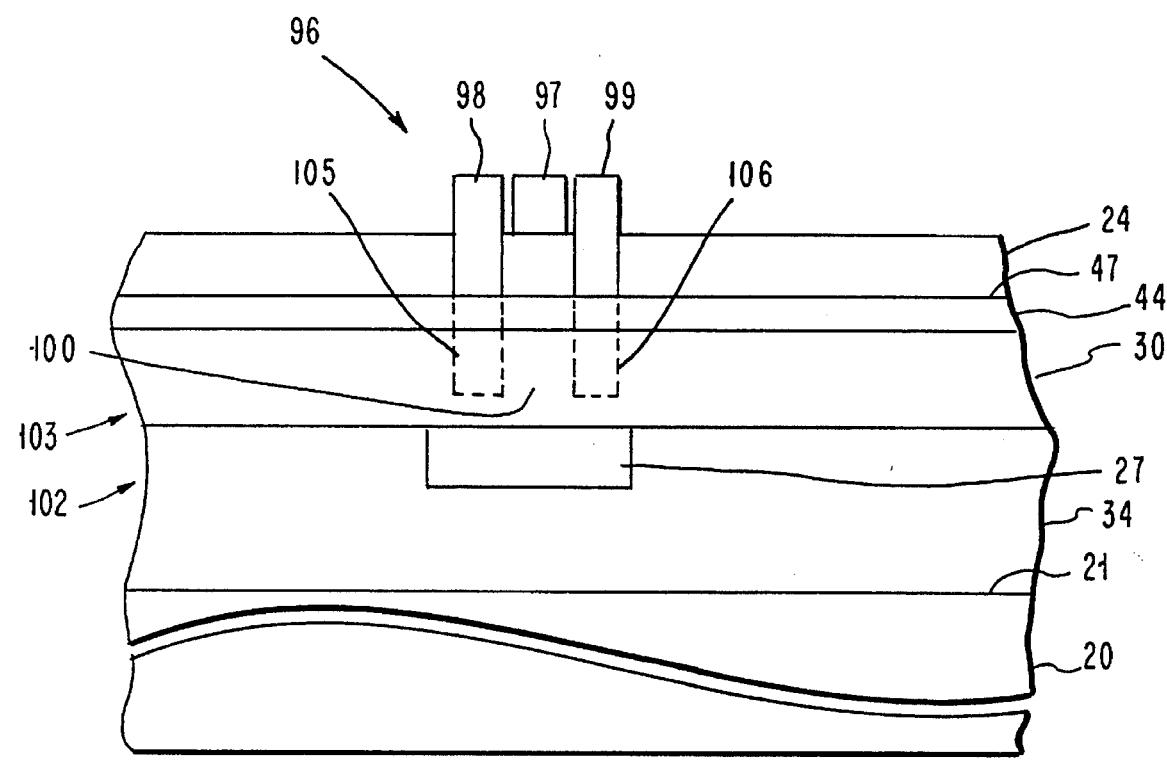
FIG. 8 is a cross section view along the line 7—7 of FIG. 6 illustrating a third embodiment.

Further after layer 34 is formed, an n type region 27 as shown in FIGS. 1 and 8 is formed in layer 34 at or near the top of layer 34 with a thickness in the range from 100 to 200 nm and has an electrically active donor dose in the range from 1 to $2\times10^{12}$cm$^{-2}$ underlying the p channel devices and associated drain and source regions to be subsequently formed. Region 27 can be formed for example by ion implantation and subsequent annealing. Region 27 may be defined by a suitably patterned mask. N type region 27 functions to block parasitic current from flowing through layer 34 or substrate 20 between the source and drain contacts of p type transistors.

On the upper surface of relaxed layer 34, an n-doped relaxed SiGe thin layer 36 is grown in order to bend the valence and conduction bands enough for the electron transport to be preferred in a tensile strained Si or Si$_{1-z}$Ge$_z$ layer 32.

The confinement of electrons and holes is a result of tensile and compressive strain in the respective layers. The overall lattice constant in the plane of the layer upper and lower surfaces is determined by the dominant composition of a layer which in FIG. 2 is layer 34. The electron channel layer 32 has either no Ge or a lower Ge composition and is under tensile strain while the hole channel layer 30 has higher Ge composition and is under compressive strain. The strain arises because pure Ge has a lattice constant about 4% greater than the lattice constant of Si.

Above n-doped layer 36, a thin relaxed undoped SiGe layer 38 is grown in order to separate the dopants in layer 36 from the Si layer 32 to maintain a high electron mobility in layer 32. Layer 38 may have a thickness in the range from 0 to 4 nanometers thick. Above layer 38, a Si or Si$_{1-z}$Ge$_z$ layer 32 is grown which is under tensile strain and functions as an n-channel for n-channel field effect transistors. Above Si or Si$_{1-z}$Ge$_z$ layer 32, a thin relaxed SiGe layer 40 is grown. Layers 38 and 40 may have the same composition of silicon and germanium which may be in a range from 20 to 50% germanium. Silicon or Si$_{1-z}$Ge$_z$ layer 32 is under tensile strain while layers 38 and 40 of SiGe are relaxed.

Above layer 40, a compressively-strained SiGe layer 30 is grown which functions as a p-channel for p-channel field effect transistors. In layer 30, the composition of germanium is in the range from 50 to 100% and may be, for example, 80%.

In an alternate embodiment, layer 30 may have the germanium content graded within the layer, decreasing from, for example, about 0.75 Ge at the lower portion of the layer nearer the buffer layer 34 to about 0.5 Ge at the upper part of the layer. The resulting graded strain and graded valence band offset in layer 30 will help to position the holes closer to the bottom interface, which is smoother than the upper interface, resulting in improved hole mobility.

Above layer 30, another thin relaxed SiGe layer 42 is grown. Layer 42 may have the same composition as layer 40 and it functions to provide strain at the interface with layer 30 causing a jump in the valence band which results in the holes being confined to layer 30. Layer 30 is under compressive strain. Above layer 42, a silicon cap layer 44 is grown in order to grow with good adhesion a gate oxide on or in its upper surface. Over silicon layer 44, a 5 to 10 nanometer thick silicon dioxide layer 24 is formed. Silicon dioxide layer 24 can be grown at a temperature of 600° to 700° C. using high pressure thermal oxidation or may be deposited by chemical vapor deposition at a temperature below 650° C. Above layer 24 a P$^+$ polysilicon gate 16 is grown which may first be a blanket layer and then lithographically patterned to define the gate. Gate 16 may be formed using a fully self-aligned process with 0.1 to 0.25 micron gate length and by using nitride sidewall spacers and silicide or salicide metallization.

Layers 30 and 32 may have a thickness in the range from 3 to 7 nm. Layer 40 between layers 30 and 32 may have a thickness in the range from 0 to 5 nm. Layers 36, 38 and 42 may have a thickness in the range from 3 to 5 nm. Silicon layer 44 may have a thickness in the range from 0.5 to 1.5 nm. If layer 44 is too thick it would be a parasitic current channel for n type devices. Layer 24 may be in the range from 5 to 10 nm.

With the ability to form tensile strained Si or $Si_{1-z}Ge_z$ on relaxed SiGe layers, and compressive strained SiGe layers on relaxed Si or SiGe, the conduction and valence bands of both Si or $Si_{1-z}Ge_z$ layer 32 and SiGe layer 30 can be significantly changed. In Si or $Si_{1-z}Ge_z$ layer 32, under tensile strain, the original six-fold degenerate conduction band is split into a two-fold and a four-fold degenerate band. Electrons travelling in the lowered two-fold band (with a light in-plane mass) have a much higher mobility than in standard Si n-channel field effect transistor structures. In the lowered two-fold band, the higher mobility may be in the range from 2,000 to 2500 $cm^2/Vs$ at 300K and 10,000 to 15,000 $cm^2/Vs$ at 77K compared to conventional n-channel transistors having a mobility of approximately 600 $cm^2/Vs$ at 300K and approximately 1500 $cm^2/Vs$ at 77K. A further discussion of electron transport properties is contained in a publication by K. Ismail (the inventor herein) et al. entitled "Electron transport properties of Si/SiGe heterostructure: measurements and device implications", Appl. Phys. Lett. 63 (5) 2 Aug. 1993, pp 660–662 which is incorporated herein by reference.

The valence band in compressively-strained SiGe layer 30 is split into the heavy hole and light-hole bands. Hole transport in the upper valence band, with light mass for hole motion along the channel especially in high Ge-content SiGe or even pure Ge, will thus enjoy hole mobilities that could be an order of magnitude higher than in Si p-channel field effect transistors. The hole mobilities in the occupied hole band are in the range from 600 to 1100 $cm^2/Vs$ or higher at 300K and in the range from 2000 to 5000 $cm^2/Vs$ at 77K which have been measured in layer 30 for a composition of 70% silicon and 30% germanium and where layer 30 was 4 nanometers thick. The measured mobilities are a factor of 5 higher than found in Si p-channel field effect transistors.

Figures 3, 4:
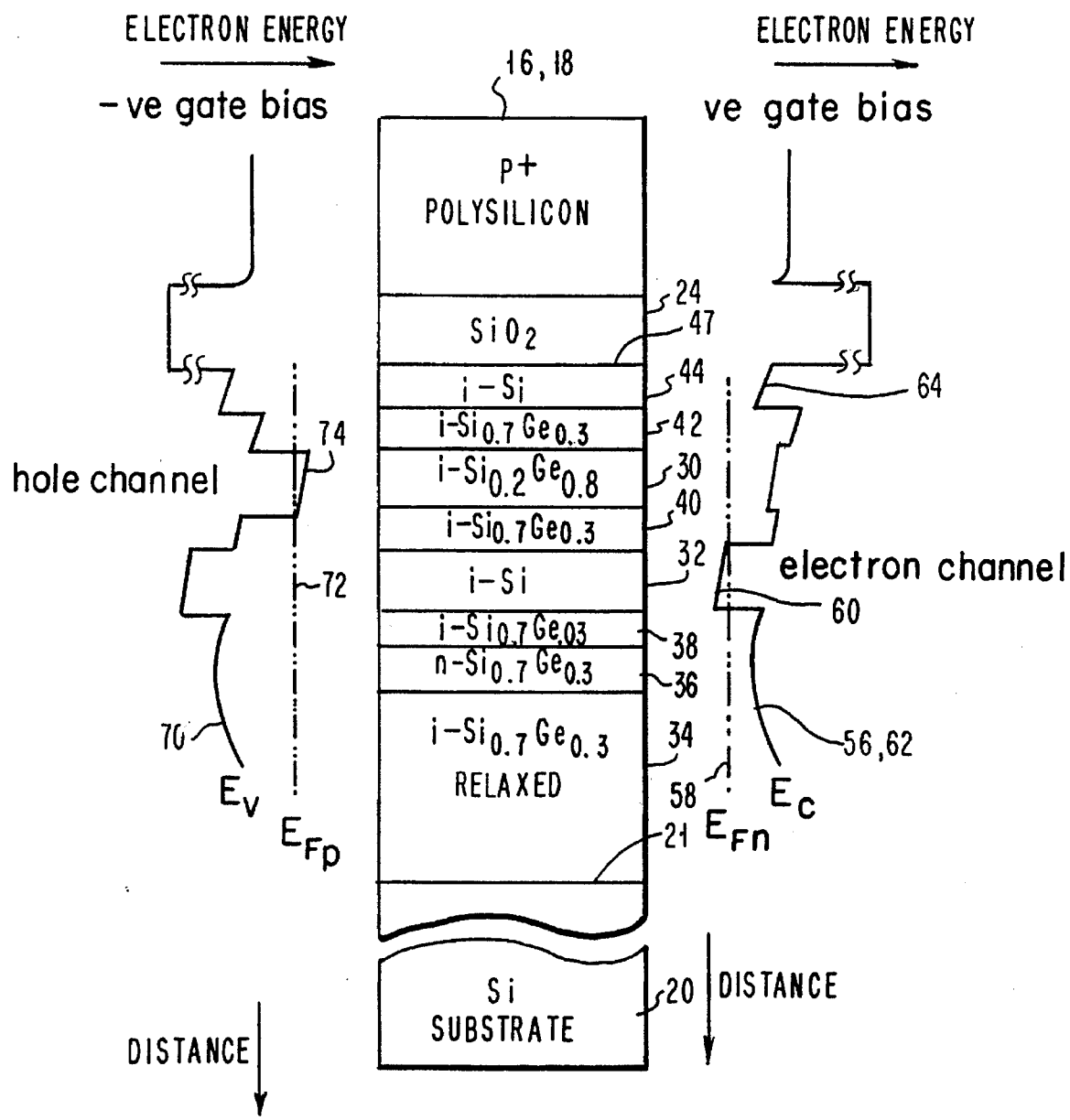
FIG. 3 is a graph showing the energy of an electron at the bottom of the conduction band as a function of distance with respect to the gate electrode with a positive gate bias $V_g$.
FIG. 4 is a graph showing the energy of an electron at the top of the valence band as a function of distance with respect to the gate electrode with a negative gate bias $V_g$.

FIG. 3 is a graph showing the energy of an electron at the bottom of the conduction band in layer 32 as a function of distance with respect to gate electrode 16 and with a positive gate voltage $V_g$. In FIG. 3 the ordinate represents the energy of a single electron at the bottom of the conduction band and the abscissa represents distance in the vertical direction below gate electrode 16 shown in FIG. 2. The energy of a single electron is shown by curve 56. Reference line 58 represents the Fermi energy in layer 32. As shown in FIG. 3 curve portion 60 shows the electron energy as being less than the Fermi energy in layer 32 and thus electrons are present in conductive layer 32. Curve portion 62 shows the bending of the conduction band due to the n-type doping in layer 36. Curve 62 is not adjusted to reflect p type region 26. Curve portion 64 shows the energy of an electron in layer 44 which is the top silicon cap layer underneath oxide layer 24. Layer 44 has a lower electron mobility than the electron mobility of layer 32 having electron energy shown by curve portion 60. The electron energy of an electron in layer 32 should be lower than the electron energy in layer 44 to prevent current from flowing in layer 44 which is a parasitic channel parallel to the n-channel formed by layer 32.

FIG. 4 is a graph showing the energy of an electron at the top of the valence band in layer 30 as a function of distance in the vertical direction shown in FIG. 2 below gate electrode 16 and where the gate bias Vg is negative. In FIG. 4 the ordinate represents the energy of an electron at the top of the valence band and the abscissa represents distance in the vertical direction with respect to gate electrode 16. The energy of an electron at the top of the valence band is shown by curve 70. Curve 70 is not adjusted to reflect p type region 26. The reference line 72 represents the Fermi energy $E_F$ in the valence band. Curve portion 74 corresponds to the electron energy at the top of the valence band in layer 30 which is greater than the Fermi energy shown by reference line 72 and thus would be conductive to holes.

FIGS. 3 and 4 show that with a positive gate voltage electrons are conductive in layer 32, the electrons being supplied from doped layer 36. With gate electron 16 having a negative voltage $V_g$ holes are conductive in layer 30. Thus, with drain and source regions interconnecting all the layers 30, 32, 34, 36, 38, 40, 42, and 44, either an n-channel or a p-channel field effect transistor may be formed by forming p-type or n-type drain and source regions on either side of gate electrode 16. Referring to FIG. 2, the fact that the electron transport in layer 32 and hole transport in layer 30 is spatially removed from the silicon layer 44 and layer 24 i.e., at silicon dioxide interface 47, gives the advantages of higher reliability i.e., reduced carrier injection into layer 24 of silicon dioxide, and higher mobility at high carrier density. With a $Si/SiO_2$ interface 47, it is known that the mobility of electrons degrades as a function of the vertical electric field across the interface. In the suggested structure, however, the mobility of electrons increases as a function of the vertical field and the hole mobility is expected to stay approximately constant over the whole gate bias range $V_g$. The unique feature of the planar heterostructure 22 is that the layer sequence which makes use of the strain due to lattice mismatching, enables the adjustment of threshold voltages for p and n-channel field transistors, and the adjustment of the high electron and hole mobilities of the n and p-channel field effect transistors. The cap silicon layer 44 allows thermal oxidation to form the gate oxide or a chemical vapor deposition (CVD) oxide with good adhesion to layer 44. The planar heterostructure 22 provides for no mobility degradation as a function of vertical electric fields from the voltage on gate electrode 16 since the electrons are transported in layer 32 and the holes are transported in layer 30. A single $p_+$ polysilicon gate may be used for both p and n-channel field effect transistors and may be deposited and patterned at the same time.

The planar heterostructure 22 can be used in building high-performance CMOS devices based on strained Si/SiGe heterostructures. Planar heterostructure 22 can be used in ULSI logic chips operated at high frequencies and low power consumption. The high frequency is a result of higher electron and hole mobility and higher average carrier velocity in the channel i.e., layer 30 and 32. The lower power consumption is expected because lower lateral electric fields are needed in order to saturate the carrier velocity.

Isolation between n and p-channel field effect transistors may be achieved by trenching between devices. Trenching may be done by reactive ion etching (RIE). In a typical embodiment, the p and n-channel field effect transistors will be self-aligned with respect to its gate electrode such that the source and drain implants grown by ion implantation reach the edge of the gate electrode. As in a CMOS circuit, the basic block would be a simple inverter with the drain of one device connected to the drain of the other device and both gates connected together. Other logic gates can be made such as a NAND, NOR, FLIP FLOPS, et cetera.

Referring to FIG. 5, a schematic circuit of CMOS inverter 9 is shown. Gate electrodes 16 and 17 are coupled together by way of lead 77 to provide an input to inverter 9. Drain regions 12 and 13 of field effect transistors 10 and 11 respectively are coupled together by way of lead 78 to provide an output. The source of transistor 11 is coupled over lead 79 to a supply voltage $V_{DD}$. The source of transistor 10 is coupled over lead 80 to ground potential or another voltage supply. Transistor 10 has an n-channel formed in layer 32 while transistor 11 has a p-channel formed in layer 30.

Figure 6:
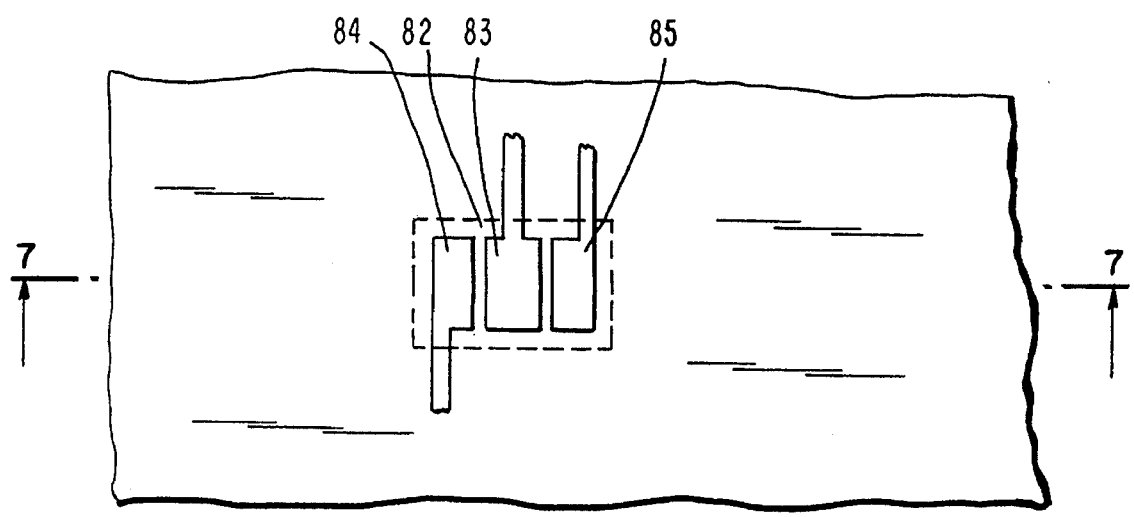
FIG. 6 is a top view of a second embodiment of the invention.

FIG. 6 is a top view of a second embodiment of the invention showing a field effect transistor 82. Field effect transistor 82 has a Gate electrode 83, a drain electrode 84 and a source electrode 85. Field effect transistor 82 is formed in planar heterostructure 88 which is shown in more detail in FIG. 7. FIG. 7 is a cross-section view along the line 7—7 of FIG. 6. In FIG. 7 like references are used for structure and functions corresponding to FIGS. 1 and 2. FIG. 7 shows a cross-section view of a plurality of layers 89 used to form a plurality of n-channel field effect transistors therein where for the sake of simplicity only one field effect transistor 82 is shown.

FIG. 7 shows an n-channel field effect transistor 82 having a drain region 91 and a source region 92 of n-type formed, for example, self aligned with the gate by ion implantation into layer 32. Semiconductor substrate 20 has a first layer 34 of relaxed $Si_{1-x}Ge_x$ formed epitaxially on the upper surface 21 of substrate 20 where x is in the range from 0.20 to 0.5. A second layer 36 of n doped $Si_{1-x}Ge_x$ is formed epitaxially on layer 34. Prior to forming layer 36, a p-type region 26 may be formed underneath the future drain region 91 and source region 92 to prevent parasitic current from flowing through layer 34 or substrate 20 from drain region 91 to source region 92 or vice-versa. A third layer 38 of undopad $Si_{1-x}Ge_x$ is formed epitaxially on layer 36. A fourth layer 32 of silicon or $Si_{1-z}Ge_z$ where the Ge fraction z is less than x is formed epitaxially on third layer 38 whereby the fourth layer 32 is under tensile strain whereby the conduction band is split into a two-fold and a four-fold degenerate band where the electron mobility in the two-fold band being in the range from 2,000 to 2,500 $cm^2/Vs$ at 300K. A fifth layer 24 of dielectric material such as silicon dioxide is formed over the fourth layer 32 on upper surface 48. Gate electrode 83 is formed over fifth layer 24. N-type regions 91 and 92 are formed on either side of gate electrode 83 in layer 32 as shown in FIG. 7. A thin silicon layer such as layer 44 may be interposed between layer 32 and layer 24 to provide a better interface with layer 24.

FIG. 8 is a cross-section view along the line 7—7 of FIG. 6 illustrating a third embodiment. In FIG. 8 like references are used for structure and functions corresponding to the apparatus of FIGS. 1, 2 and FIG. 6. Field effect transistor 96 is a p type having a gate electrode 97, a drain electrode 98 and a source electrode 9. Drain electrode 98 is in electrical contact with drain region 105 which is p type and source electrode 99 is in electrical contact with source region 106 which is p type. Drain region 105 and source region 106 extend through layers 44 and into layer 30. Drain region 105 and source region 106 may be self aligned with the gate and formed by ion implantation. Field effect transistor 96 has increased hole mobility in its channel 100 between source electrode 106 and drain electrode 105.

Field effect transistor 96 is formed in planar heterostructure 102 which comprises a plurality of layers 103. Field effect transistor 96 comprises a semiconductor substrate 20, a first layer 34 of relaxed $Si_{1-x}Ge_x$ formed epitaxially on substrate 20 where x is in the range from 0.20 to 0.5. A second layer 30 of $Si_{1-y}Ge_y$ is formed epitaxially on first layer 34 where the Ge fraction y is in the range of 0.5 to 1 and where y–x is greater than 0.2 whereby the second layer 30 is under compressive strain resulting in hole confinement therein. A third layer 44 of silicon is formed epitaxially on the second layer 30. A fourth layer 24 of dielectric material such as silicon dioxide is formed over the third layer 44. A gate electrode 97 is formed over the fourth layer 24. Drain region 105 and source region 106 are formed on either side of the gate electrode 97 in second layer 30 and third layer 44. An n-type region 27 may be formed below drain region 105 and source region 106 in layer 34 from its upper surface of layer 34 to prevent parasitic currents from flowing in layer 34 or substrate 20 between drain region 105 and source region 106. N-type region 27 may be formed by diffusion through a mask or by ion implantation after layer 34 is formed.

While there has been described and illustrated a method and a planar heterostructure with strained Si and Si/Ge layers for p and n-channel field effect transistors, it will be apparent to those skilled in the art that modifications and variations are possible without deviating from the broad scope of the invention which shall be limited solely by the scope of the claims appended hereto.

Having thus best described our invention, what we claim as new and desire to secure by Letters Patent is:

1. A layered structure for forming both n and p channel field effect transistors therein comprising:

a single crystalline substrate, a first layer of relaxed $Si_{1-x}Ge_x$ formed epitaxially on said substrate where the Ge fraction x is in the range from 0.20 to 0.5, a second layer of n doped $Si_{1-x}Ge_x$ formed epitaxially on said first layer, a third layer of undoped $Si_{1-x}Ge_x$ formed epitaxially on said second layer, a fourth layer selected from the group consisting of silicon and silicon-germanium formed epitaxially on said third layer whereby said fourth layer is under tensile strain, a fifth layer of relaxed $Si_{1-x}Ge_x$ formed epitaxially on said fourth layer, a sixth layer of $Si_{1-y}Ge_y$ formed epitaxially on said fifth layer where the Ge fraction y is in the range from 0.5 to 1.0 and where y–x>0.2 whereby said sixth layer is under compressive strain, a seventh layer of relaxed $Si_{1-x}Ge_x$ formed epitaxially on said sixth layer, an eighth layer of silicon formed epitaxially on said seventh layer, and a ninth layer of dielectric material formed over said eighth layer.

2. The layered structure of claim 1 further including a tenth layer of polysilicon formed over said ninth layer of dielectric material and patterned lithographically to form gate electrodes.

3. The layered structure of claim 2 further including p regions passing from said sixth layer through said eighth layer on either side of at least one of said gate electrodes to form a p-channel field effect transistor.

4. The layered structure of claim 2 further including P-type source and drain regions located at least in said sixth layer.

5. The layered structure of claim 2 further including n regions passing from said fourth layer through said eighth layer on either side of at least one of said gate electrodes to form an n-channel field effect transistor.

6. The layered structure of claim 2 further including n-type source and drain regions located at least in said fourth layer.

7. The layered structure of claim 3 further including n regions passing from said fourth layer through said eighth layer on either side of at least one of said gate electrodes to form an n-channel field effect transistor.

8. The layered structure of claim 7 further including means for interconnecting said gate electrodes, said p regions and said n regions to form complementary metal oxide semiconductor (CMOS) logic.

9. The layered structure of claim 5 wherein said first layer further includes p type regions below the area of n channel transistors to prevent parasitic currents in or below said first layer.

10. The layered structure of claim 3 wherein said first layer further includes n type regions below the area of p channel transistors to prevent parasitic currents in or below said first layer.

11. The layered structure of claim 1 further including a tenth layer of metal formed over said ninth layer of dielectric material and patterned lithographically to form gate electrodes.

* * * * *